(12) United States Patent
Murai et al.

(10) Patent No.: US 8,119,249 B2
(45) Date of Patent: Feb. 21, 2012

(54) SILICONE RESIN COMPOSITION

(75) Inventors: Shinji Murai, Sagamihara (JP); Koji Asakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 574 days.

(21) Appl. No.: 12/339,501

(22) Filed: Dec. 19, 2008

(65) Prior Publication Data

US 2009/0189180 A1 Jul. 30, 2009

(30) Foreign Application Priority Data

Jan. 24, 2008 (JP) ................... 2008-013935

(51) Int. Cl.
*B32B 9/04* (2006.01)
*B32B 9/06* (2006.01)
(52) U.S. Cl. ............ 428/447; 430/58.2; 430/58.05; 525/100; 525/104; 525/105; 525/106; 525/366; 526/328; 526/329.7; 526/346
(58) Field of Classification Search .......... 430/58.2, 430/58.05; 525/100, 104, 105, 106, 366; 526/328, 329.7, 346; 428/447
See application file for complete search history.

(56) References Cited

U.S. PATENT DOCUMENTS

2008/0220266 A1 9/2008 Murai et al.
2009/0277581 A1* 11/2009 Mori et al. .............. 156/329

FOREIGN PATENT DOCUMENTS

| JP | 2000-198930 | 7/2000 |
| JP | 2005-42099 | 2/2005 |
| JP | 2007-103494 | 4/2007 |
| JP | 2008-214512 | 9/2008 |

* cited by examiner

*Primary Examiner* — Terressa Boykin
(74) *Attorney, Agent, or Firm* — Finnegan, Henderson, Farabow, Garrett & Dunner, L.L.P.

(57) ABSTRACT

A silicone resin composition is provided, which includes polysiloxane including (PSA1), (PSA2), (PSB) and (PSC), and a hydrosilylating catalyst, wherein a weight ratio between (PSA2) and (PSA1) (w2/w1) is 0.03-0.2:

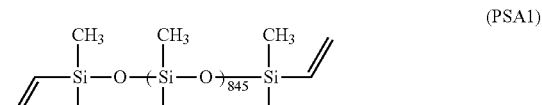

(PSA1)

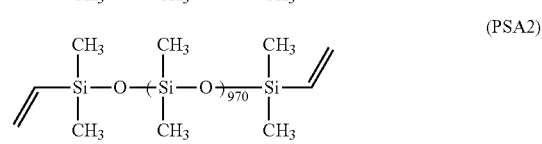

(PSA2)

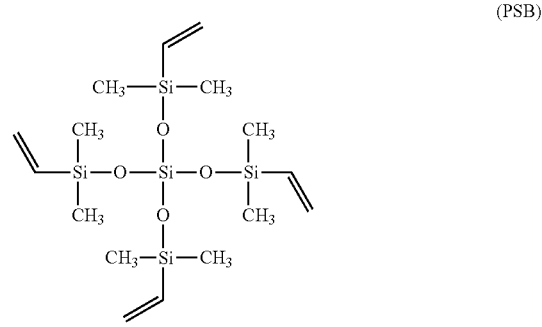

(PSB)

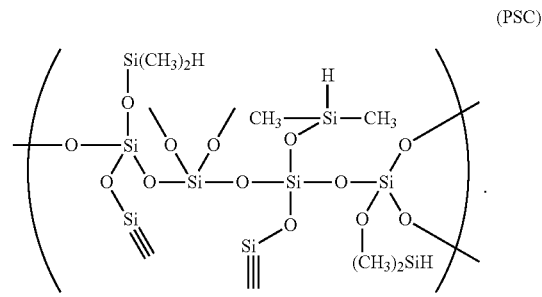

(PSC)

20 Claims, 1 Drawing Sheet

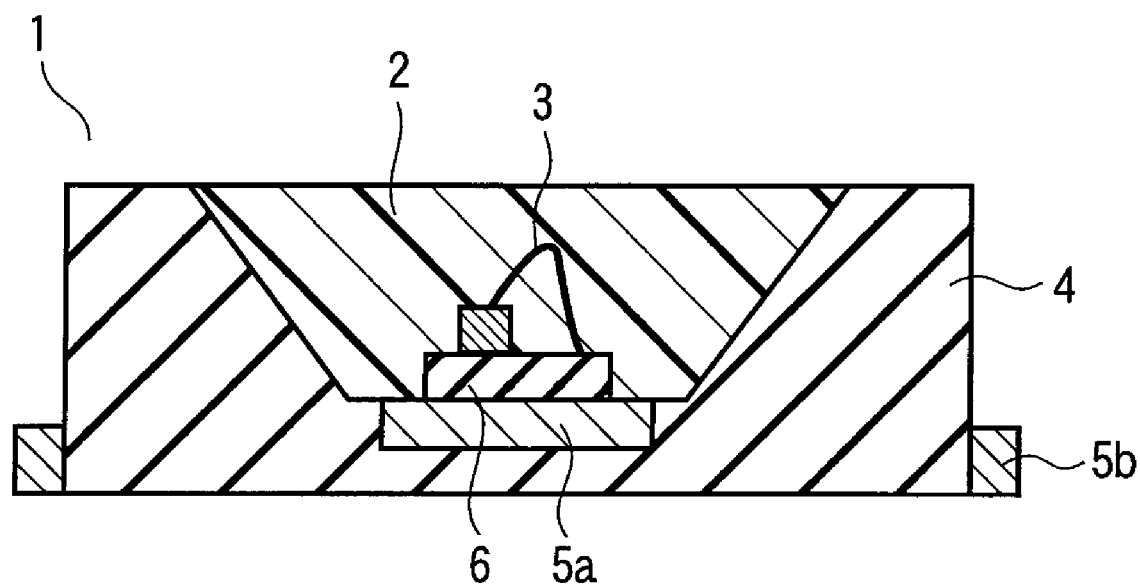

SILICONE RESIN COMPOSITION

CROSS-REFERENCE TO RELATED APPLICATIONS

This application is based upon and claims the benefit of priority from prior Japanese Patent Application No. 2008-013935, filed Jan. 24, 2008, the entire contents of which are incorporated herein by reference.

BACKGROUND OF THE INVENTION

1. Field of the Invention

This invention relates to a silicone resin composition and to a semiconductor device using the silicone resin composition.

2. Description of the Related Art

A white LED is accompanied with an increasing problem that the epoxy resin sealing material employed therein turns to yellow during the actual use thereof due to the exposure thereof to ultraviolet rays, etc. Additionally, due to the recent trend to further miniaturize the white LED, the amount of heat released from the white LED increases, resulting in the generation of cracks in the epoxy resin sealing material. Therefore, it is urgently demanded to take countermeasures to cope with this new problem. In order to cope with these problems, attempts are being taken to employ silicone resin having a large number of phenyl groups in the molecule thereof.

As the light source for the LED in future, there is an increasing trend to use one which is further lower in wavelength. Due to the fact that the conventional epoxy sealing material as well as phenyl-containing silicone resin is inferior in light transmission properties at lower wavelength regions, it is expected to become difficult to apply these materials to an LED where a lower wavelength region is employed as a light source. Although resin compositions containing a linear or cyclic silicone resin have been also proposed as a sealing material for the LED in JP-A 2000-198930 (KOKAI), JP-A 2005-42099 (KOKAI) and JP-A 2007-103494 (KOKAI) for example, even with these conventional resin compositions, it is impossible to secure a sufficient degree of adhesion due to the cure shrinkage thereof. Furthermore, when the resin composition is relatively low in hardness, there is also a problem of the disconnection of wiring.

BRIEF SUMMARY OF THE INVENTION

A silicone resin composition according to one aspect of the present invention comprises:

a) a first opposite terminals-sealed-with-vinyl-group-type silicone resin represented by the following general formula (A1) and incorporated at a first weight (w1);

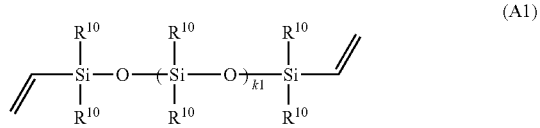

wherein $R^{10}$s may be the same or different and are individually selected from an alkyl group having 1 to 4 carbon atoms; and k1 is a number satisfying $800 \leq k1 < 900$;

b) a second opposite-terminals-sealed-with-vinyl-group-type silicone resin represented by the following general formula (A2) and incorporated at a second weight (w2);

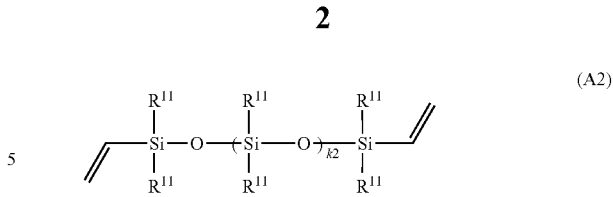

wherein $R^{11}$s may be the same or different and are individually selected from an alkyl group having 1 to 4 carbon atoms; k2 is a number satisfying $k1+100 \leq k2 < 1300$; and w2 is a value satisfying $0.03 \leq w2/w1 < 0.2$;

c) an alkenyl-group-containing polysiloxane represented by the following formula (B):

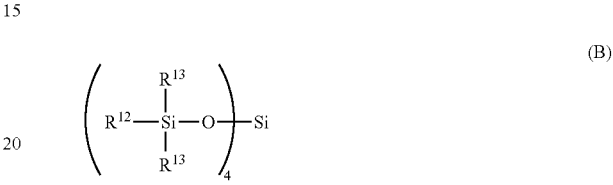

wherein $R^{12}$ is an alkenyl group; and $R^{13}$ is an alkyl group having 1 to 4 carbon atoms;

d) a hydro-group-containing polysiloxane represented by the following average composition formula (C):

$$R^{14}{}_m SiO_{(4-m)/2}(SiO_2) \quad (C)$$

wherein $R^{14}$ constituted by 0.1 to 95 mole % of a hydro group and the balance of an alkyl group having 1 to 4 carbon atoms; and m is an integer of 1 to 3; the hydro-group-containing polysiloxane having a weight average molecular weight of 100 to 10000 and including 10 to 50 mole % of Q unit represented by formula:

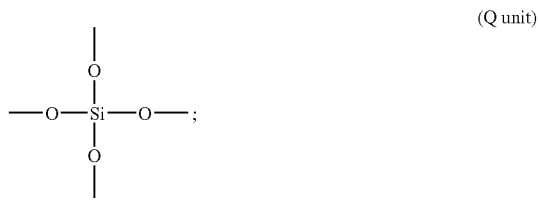

and e) a hydrosilylating catalyst.

A resin-encapsulated semiconductor device according to another aspect of the present invention comprises:

a light-emitting element; and a resin layer sealing the light-emitting element and formed of a cured material of the above-mentioned silicon resin composition.

BRIEF DESCRIPTION OF THE SEVERAL VIEWS OF THE DRAWING

FIGURE is a diagram schematically illustrating the structure of a semiconductor device according to one embodiment.

DETAILED DESCRIPTION OF THE INVENTION

Next, embodiments will be explained.

The silicone resin composition according the embodiment comprises four different kinds of specific polysiloxane and a hydrosilylating catalyst.

A first polysiloxane to be included in the silicone resin composition according to one embodiment is a first opposite-terminals-sealed-with-vinyl-group-type silicone resin represented by the aforementioned general formula (A1). In this general formula (A1), $R^{10}$s may be the same or different and are individually selected from an alkyl group having 1 to 4 carbon atoms. Because of low-cost and easiness in synthesis, the $R^{10}$s should more preferably be constituted by a methyl group or an ethyl group.

The k1 in the aforementioned general formula (A1) is confined to not less than 800 to less than 900. The first opposite-terminals-sealed-with-vinyl-group-type silicone resin is incorporated in the silicone resin composition for the purpose of adjusting the viscosity of the silicone resin composition. If the value of k1 is less than 800, a cured product to be obtained would become fragile. On the other hand, if the value of k1 is 900 or more, the effects to lower the viscosity of the silicone resin composition would be insufficient disadvantageously. Preferably, the viscosity of the silicone resin composition should be confined to the range of 5,000 to 16,000 mPa·s. As long as the viscosity of the silicone resin composition is confined within this range, it is possible to prevent the deterioration in cured state of the cured product. More preferably, the viscosity of the first opposite-terminals-sealed-with-vinyl-group-type polysiloxane should be confined to 7,000 to 12,000 mPa·s.

A second polysiloxane to be included in the silicone resin composition according to one embodiment is a second opposite-terminals-sealed-with-vinyl-group-type silicone resin represented by the aforementioned general formula (A2). In this general formula (A2), $R^{11}$s may be the same or different and are individually selected from an alkyl group having 1 to 4 carbon atoms. Because of low-cost and easiness in synthesis, the $R^{11}$s should more preferably be constituted by a methyl group or an ethyl group.

The k2 in the aforementioned general formula (A2) is confined to not less than (k1+100) to less than 1300. The second opposite-terminals-sealed-with-vinyl group-type silicone resin is used for enhancing the adhesion. If the value of k2 is less than (k1+100), the second opposite-terminals-sealed-with-vinyl-group-type silicone resin would become similar in characteristics to the first opposite-terminals-sealed-with-vinyl-group-type silicone resin, thereby making it difficult to obtain a cured product exhibiting a sufficient adhesion. On the other hand, if the value of k2 is larger than 1300, the viscosity of the silicone resin composition would become too high, thereby deteriorating the workability of the silicone resin composition. Preferably, the viscosity of the silicone resin composition should be confined to the range of 18,000-40,000 mPa·s. As long as the viscosity of the silicone resin composition is confined to this range, it is possible to prevent the deterioration in the cured state of silicone resin composition. More preferably, the viscosity of this first opposite-terminals-sealed-with-vinyl-group-type polysiloxane should confined to the range of 19,000-30,000 mPa·s.

This second opposite-terminals-sealed-with-vinyl-group-type silicone resin is the same in construction with the first opposite-terminals-sealed-with-vinyl-group-type silicone resin in every respects except that the number of repeating units of organosiloxane constituting the main chain of this second opposite-terminals-sealed-with-vinyl-group-type silicon resin is larger than that of the first opposite-terminals-sealed-with-vinyl-group-type silicone resin. The employment of two kinds of opposite-terminals-sealed-with-vinyl-group-type silicone resins which are similar in fundamental structure to each other is advantageous in the respects that it is possible to obtain a cured product which is not only sufficiently high in hardness but also excellent in adhesion. These first and second opposite-terminals-sealed-with-vinyl-group-type silicone resins are employed herein as a base polymer.

Due to the combined use of two kinds of opposite-terminals-sealed-with-vinyl-group-type silicone resins, i.e., the first and the second opposite-terminals-sealed-with-vinyl-group-type silicone resins which differ in the length of repeating unit from each other, it is now possible to concurrently satisfy both of hardness and transparence of the cured product. If the first opposite-terminals-sealed-with-vinyl-group-type silicone resin is not contained in the silicone resin composition, not only the viscosity of the silicone resin composition would become too high but also the cured product to be obtained would become cloudy. On the other hand, if the second opposite-terminals-sealed-with-vinyl-group-type silicone resin is not contained in the silicone resin composition, the hardness of the cured product to be obtained would become insufficient.

However, the weight ratio (w2/w1) between the content w2 of the second opposite-terminals-sealed-with-vinyl-group-type silicone resin and the content w1 of the first opposite-terminals-sealed-with-vinyl-group-type silicone resin should be regulated to the below-mentioned range.

$$0.03 \leq w2/w1 \leq 0.2$$

When the weight ratio (w2/w1) is less than 0.03, it may become difficult to obtain a cured product having a sufficiently high hardness. On the other hand, if the weight ratio (w2/w1) is larger than 0.2, not only the viscosity of the silicone resin composition would become too high but also the cured product to be obtained would become poor in transparency. More preferably, the weight ratio (w2/w1) should be confined to the range of 0.04 to 0.18.

Due to the suitable combined use of two kinds of opposite-terminals-sealed-with-vinyl-group-type silicone resins which differ in the length of repeating unit from each other, it is now possible to obtain a silicone resin composition which is excellent not only in hardness but also in transparency.

With respect to specific examples of the first opposite-terminals-sealed-with-vinyl-group-type silicone resin, it is possible to employ the opposite-terminals-sealed-with-vinyl-group-type polydimethyl silicone resins as shown below.

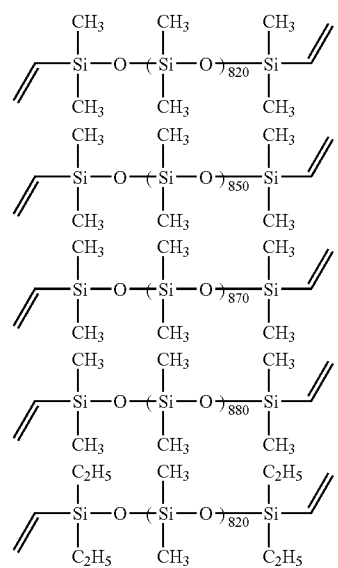

-continued

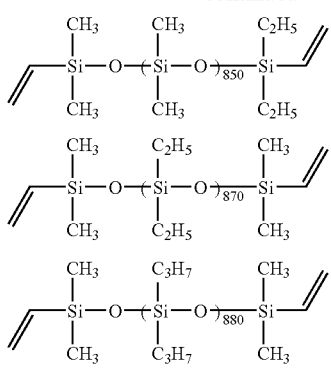

With respect to specific examples of the second opposite-terminals-sealed-with-vinyl-group-type silicone resin, it is possible to employ the opposite-terminals-sealed-with-vinyl-group-type polydimethyl silicone resins as shown below.

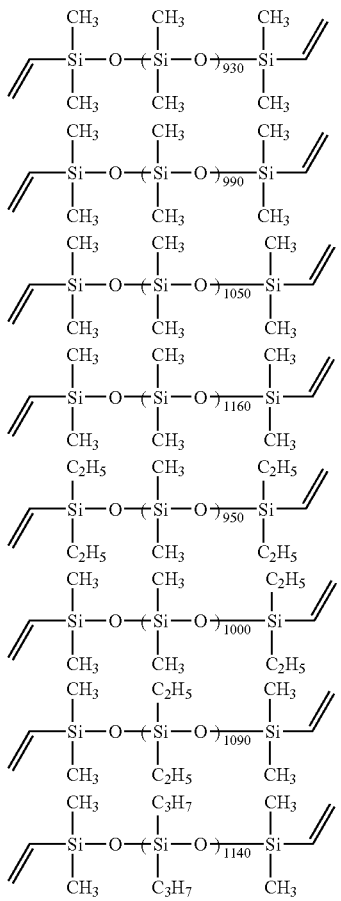

With respect to the content of the base polymer constituted by the first and the second opposite terminal vinyl groups sealing type silicone resins, it should preferably be confined to the range of 40 to 80 wt %, more preferably 50 to 75 wt % based on a total weight of the silicone resin composition.

A third polysiloxane to be included in the silicone resin composition is an alkenyl-group-containing polysiloxane represented by the following general formula (B):

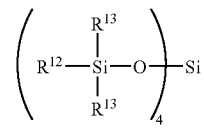

In this general formula (B), $R^{12}$ is an alkenyl group such as a vinyl group, allyl group, butenyl group and pentenyl group. In view of the transparency of silicone resin after the curing thereof and the availability thereof, a vinyl group is especially preferable as the alkenyl group. $R^{13}$s may be the same or different and are individually selected from an alkyl group having 1 to 4 carbon atoms. In view of low-cost and easiness in synthesis, the $R^{13}$s should more preferably be constituted by a methyl group.

At least one of the hydrogen atoms in the aforementioned alkenyl group and alkyl group may be substituted by a heteroatom such as a halogen, Si, O, N or S atom.

The alkenyl-group-containing polysiloxane represented by the aforementioned general formula (B) may be assumed as being a minimum unit of Q structure. Due to the incorporation of this component in the resin composition, it is possible to enhance the cross-linking density, so that when this alkenyl-group-containing polysiloxane is used together with the aforementioned opposite-terminals-sealed-with-vinyl-group-type silicone resin, it is now possible to obtain a cured product which is further enhanced in hardness. Moreover, since this alkenyl-group-containing polysiloxane is relatively small in molecular weight and hence low in viscosity, it is useful as a diluent for the reactivity of the opposite-terminals-sealed-with-vinyl-group-type silicone resin exhibiting a high viscosity.

As a result, it is possible to enable the silicone resin composition to have a viscosity which is convenient in pouring the silicone resin composition from a syringe into a package having a chip mounted therein. The viscosity of the silicone resin composition should preferably be confined to the range of 500 to 20,000 mPa·s/25° C., more preferably 1,000 to 10,000 mPa·s/25° C.

Examples of the alkenyl-group-containing polysiloxane represented by the aforementioned general formula (B) include the following compounds.

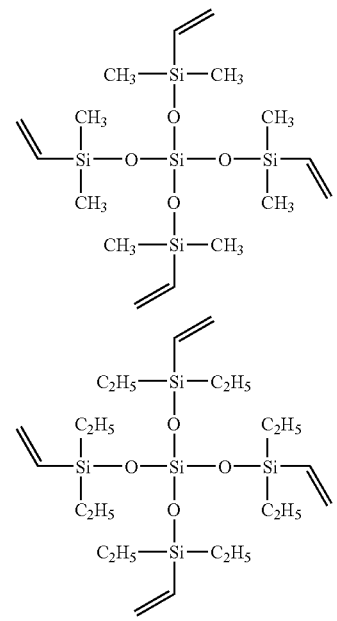

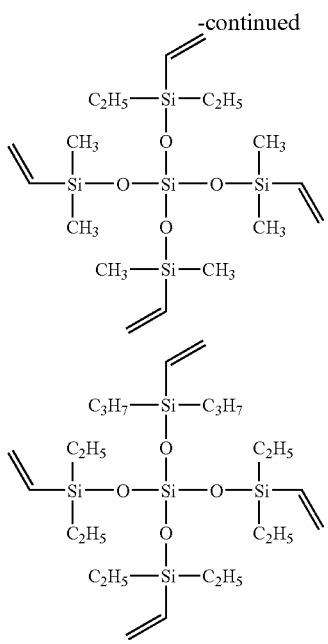

The content of the alkenyl-group-containing polysiloxane should preferably be confined to the range of 10 to 40 wt %, more preferably 15 to 30 wt % based on a total weight of the silicone resin composition.

A fourth polysiloxane to be included in the silicone resin composition is a hydro-group-containing polysiloxane represented by the following average composition formula (C). This hydro-group-containing polysiloxane reacts with the aforementioned opposite-terminals-sealed-with-vinyl-group-type silicone resins and with alkenyl-group-containing polysiloxane to generate a hydrosilylation reaction, thus acting as a crosslinking agent for curing the silicone resin composition.

$$R^{14}_m SiO_{(4-m)/2}(SiO_2) \quad (C)$$

0.1 to 95 mole % of $R^{14}$ in the average composition formula (C) should be occupied by a hydro group. If the content of the hydro group is too small, the curing of the resin composition would become difficult. On the other hand, if the content of the hydro group is too large, an unreacted hydro group may remain, thereby generating a problem that the stability of cured material may be badly affected by the unreacted residual hydro group.

The balance of $R^{14}$ in the average composition formula (C) should be occupied by an alkyl group having 1 to 4 carbon atoms. In view of easiness of synthesis and cost, the employment of a methyl group is most preferable among the alkyl group.

The hydro-group-containing polysiloxane represented by the aforementioned average composition formula (C) contains 10 to 50 mole % of Q unit represented by the following formula:

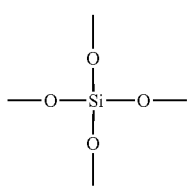
(Q unit)

As shown by this formula, Q unit is configured such that four bonding hands of an Si atom are bonded to an O atom, thus enabling these bonding hands to have a functional group, respectively. Due to this specific structure, the Q unit is advantageous in that the crosslink density can be enhanced, resulting in an increased hardness of the cured material to be obtained. As long as the content of Q unit in the aforementioned average composition formula (C) is 10 mole % or more, it is possible to secure this advantage. However, if the content of Q unit is too large, the hardness of the cured material to be obtained would become too high, thereby raising a problem that it may become difficult to secure desirable adhesive property. Therefore, the upper limit in content of Q unit in the aforementioned average composition formula (C) would be at most 50 mole %.

The hydro-group-containing polysiloxane represented by the aforementioned average composition formula (C) should be selected from those having a weight average molecular weight (as reduced in terms of polystyrene by gel permeation chromatography [GPC]) ranging from 100 to 10,000. If the weight average molecular weight of the hydro-group-containing polysiloxane is less than 100, it may become difficult to obtain a cured material having a sufficiently high mechanical strength. On the other hand, if the weight average molecular weight of the hydro-group-containing polysiloxane is higher than 10,000, the synthesis thereof would be difficult. The weight average molecular weight of the hydro-group-containing polysiloxane should preferably be confined to the range of 200 to 5,000, more preferably 400 to 3,000.

Incidentally, when the easiness of synthesis of polysiloxane is taken into account, "m" in the aforementioned average composition formula (C) should preferably be confined to the range of 1 to 3. When the hardness of cured material to be obtained is taken into account, it is especially preferable to confine the value of "m" to 2.4.

This hydro-group-containing polysiloxane may be partially consisted of $RSiO_{3/2}$ (T unit).

For example, the of M, D and Q unit contents are formulated to confine the Q unit content to 10-50 mole %, the M unit content to 10-80 mole %, and the D unit content to 0-20 mole %. The hydro-group-containing polysiloxane formulated in this manner can be synthesized by a method wherein compounds for constituting specific units of raw materials (M, D and Q units) are mixed together in the aforementioned contents and by subjecting these compounds to cohydrolysis in the presence of an acid.

As the raw materials for $SiO_2$ unit (Q unit), they include sodium silicate, alkyl silicate, polyalkyl silicate and silicon tetrachloride.

As the examples of raw materials for $R_3SiO_{0.5}$ unit (M unit) wherein hydrogen atom and alkyl group are bonded to the same silicon atom, they include the compounds which can be represented by the following chemical formulas. In these examples, alkyl group is represented by methyl group or ethyl group.

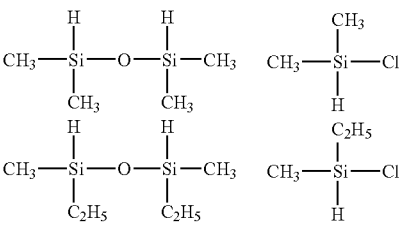

Further, examples of raw material for R'$_3$SiO$_{0.5}$ unit (M unit) wherein only alkyl group is bonded to the same silicon atom include compounds represented by the following chemical formulas. In these examples, alkyl group is represented by methyl group or ethyl group.

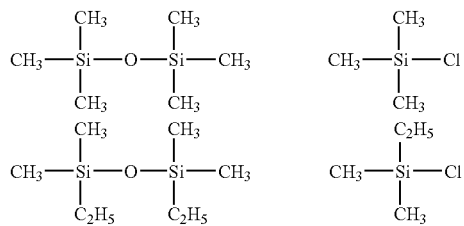

Further, examples of raw material for R$_2$SiO$_{2/2}$ unit (D unit) wherein hydrogen atom and alkyl group are bonded to the same silicon atom or wherein only alkyl group is bonded to the same silicon atom include compounds represented by the following chemical formulas. In these examples, an alkyl group is represented by a methyl group or an ethyl group.

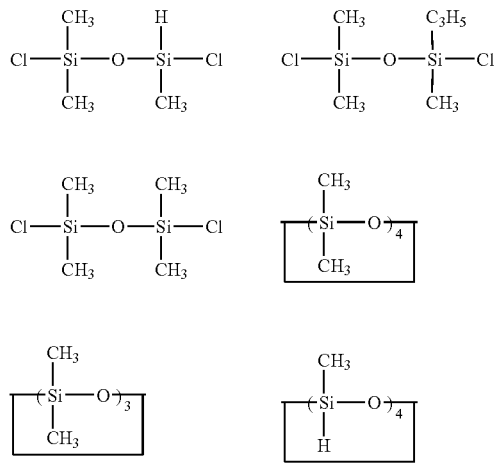

To the molecule of the hydro-group-containing polysiloxane as described above, an adhesion-imparting component may be bonded. Alkoxy-containing silyl group that has been reacted with the hydro group in the average composition formula (C) acts as the adhesion-imparting component. This adhesion-imparting component is capable of enabling alkenylalkoxy silane to preliminarily react with some of hydro group of hydro-group-containing polysiloxane. In order to enable this reaction to proceed sufficiently, the hydro-group-containing polysiloxane having an adhesion-imparting component linked thereto should preferably be incorporated at such an amount that the number of hydrogen atoms bonded to silicon atom falls within the range of 0.5-2 per alkenyl group of alkenyl-group-containing polysiloxane. If the number of hydrogen atoms is less than 0.5, the adhesive properties of the resultant resin may become insufficient. If the number of hydrogen atoms is larger than 2, the compatibility of the resultant resin may be deteriorated.

As examples of hydro-group-containing polysiloxane to be incorporated into the silicone resin composition according to one embodiment, they include those represented by the following formula.

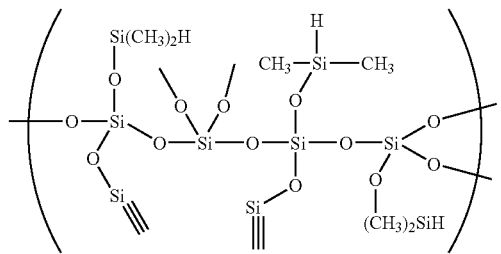

More specifically, examples of hydro-group-containing polysiloxane include those which can be obtained through the reaction between the hydro group of HQM105 (GELEST Co., Ltd.) and of HQM107 (GELEST Co., Ltd.) both comprising the Q unit and alkenylalkoxy silane in the presence of a catalyst such as platinic chloride. As the alkenylalkoxy silane to be employed in this case, it is possible to employ a compound represented by the following general formula.

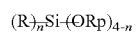

(R)$_n$Si(OR$_p$)$_{4-n}$ wherein n is an integer of 1 to 3; R is alkenyl group including, for example, vinyl group having 2-8 carbon atoms, allyl group, butenyl group and pentenyl group, more preferable example thereof being vinyl group; and R$_p$ is monovalent hydrocarbon group including, for example, alkyl group having 1-18 carbon atoms such as methyl, ethyl, propyl, butyl, hexyl, dodecyl and octadecyl, more preferable example thereof being methyl and ethyl. Some of OR$_p$ may be substituted by a monovalent hydrocarbon group or a hydrogen atom. More specific examples of the alkenylalkoxy silane include vinyltrimethoxy silane and vinyltriethoxy silane.

Through a reaction between the aforementioned alkenylalkoxy silane and the aforementioned hydro-group-containing polysiloxane, it is possible to obtain a hydro-group-containing siloxane resin having an adhesion-imparting agent directly bonded thereto and represented, for example, by the following formula.

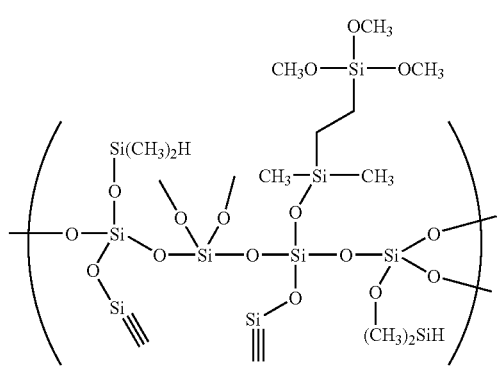

The silicone resin composition according to one embodiment further comprises a platinum catalyst as a catalyst for executing the crosslinking of resin through hydrosilylating reaction between the aforementioned alkenyl-group-containing polysiloxane and the aforementioned hydro-group-containing polysiloxane.

Examples of the platinum catalyst include a simple substance of platinum; solid platinum carried on a carrier such as alumina, silica, carbon black, etc.; platinic chloride; a complex of platinic chloride with alcohol, aldehyde, ketone, etc.; a platinum-olefin complex (for example, Pt(CH$_2$=CH$_2$)$_2$ (PPh₃)₂, Pt(CH₂=CH₂)₂Cl₂); a platinum-vinyl siloxane complex (for example, Pt(ViMe₂SiOSiMe₂Vi)ₙ, Pt[(MeViSiO)₄]ₘ); a platinum-phosphine complex (for example, Pt(PPh₃)₄, Pt(PBu₃)₄); a platinum-phosphite complex (for example, Pt[P(OPh)₃]₄, Pt[P(OBu)₃]₄)(wherein Me is methyl group, Bu is butyl group, Vi is vinyl group, Ph is phenyl group, and n and m are individually an integer); dicarbonyldichloroplatinate; and Karstedt catalyst.

Further, it is also possible to employ non-platinum-based catalyst such as RhCl(PPh₃)₃, RhCl₃, RhAl₂O₃, RuCl₃, IrCl₃, PdCl₂.2H₂O, NiCl₂, etc.

Among these catalysts, it is more preferably to employ platinic chloride, a platinum-olefin complex and a platinum-vinyl siloxane complex. Further, these catalysts may be employed singly or in combination of two or more kinds.

Although there is not any specific limitation with regard to the content of the platinum catalyst, as long as the platinum catalyst is incorporated at a content of 0.1-500 ppm or so based on a total weight of the entire resin composition, it is possible to secure the effects of the catalyst.

As described above, the silicone resin composition according to one embodiment comprises four specific kinds of polysiloxane. The base polymer is constituted by the first polysiloxane or the first opposite-terminals-sealed-with-vinyl-group-type silicone resin, and by the second polysiloxane or the second opposite-terminals-sealed-with-vinyl-group-type silicone resin. Since two kinds of opposite-terminals-sealed-with-vinyl-group-type silicone resins both having the same configuration excepting the number of repeating units are contained in the resin composition, it is possible to secure the hardness and the transparency of the cured material.

Due to the existence of these opposite-terminals-sealed-with-vinyl-group-type silicone resins, it is possible to enhance the adhesion of the resin composition to a substrate or metals. Further, since the resin composition does not contain any kind of substituent groups which exhibit the absorption of the light of ultraviolet region such as an aromatic ring or ester, a cured product of the silicone resin composition according to one embodiment is almost free from discoloration with time.

The alkenyl-group-containing polysiloxane constituting the third polysiloxane and the hydro-group-containing polysiloxane constituting the fourth polysiloxane both comprise a specific amount of Q unit which is small in cure shrinkage. Due to the presence of the Q unit, it is possible to secure excellent adhesive property of the resin composition to a substrate such as polyphthalamide or to metals. Moreover, since these polysiloxanes contain no unsaturated bond, it is possible to enhance the light transmission properties thereof to the light of ultraviolet rays in particular.

Additionally, due to the inclusion of four kinds of polysiloxane, it is possible, with the employment of the silicone resin composition according to the embodiment, to obtain a cured product which is excellent in light transmitting properties and adhesion. Therefore, this silicone resin composition according is especially suited for use as a silicone resin composition for a white light-emitting diode (LED) device.

In addition to the aforementioned components, the silicone resin composition according to one embodiment may further comprise, insofar as the adhesive properties of the silicone resin composition is not badly affected, a chain silicone resin, a cyclic silicone resin, or a cage silicone resin. Examples of the silicone resin include polyorganoalkenyl siloxane and polyorganohydrogen siloxane.

As examples of the linear polyorganoalkenyl siloxane, they include compounds represented by the following general formula (a-1).

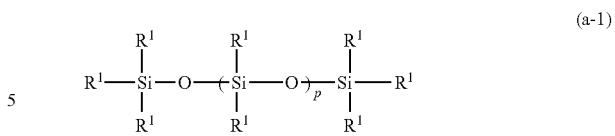

In this general formula (a-1), p is an integer ranging from 0 to 10,000, at least two of $R^1$s are respectively an alkenyl group and the balance thereof may be the same or different and are individually selected from a monovalent hydrocarbon group having 1-18 carbon atoms. With respect to the examples of the alkenyl group, they include a vinyl group, allyl group, 1-butenyl group and 1-hexenyl group. In view of easiness of synthesis, a vinyl group is more preferable. The alkenyl group may be introduced as $R^1$ into a terminal of the molecular chain or into a midpoint of the molecular chain. However, if the alkenyl group is bonded at least to the silicon atoms existing at the opposite terminals of the molecular chain, it is possible to accelerate the curing speed and to enhance the physical properties of cured material.

On the other hand, with respect to examples of the monovalent hydrocarbon group to be introduced as $R^1$ into the aforementioned general formula (a-1), they include for example an alkyl group, aryl group and aralkyl group. At least one of the hydrogen atoms in these hydrocarbon groups may be substituted by a heteroatom such as a halogen, Si, O, N or S atom. When the easiness of synthesis and excellent light transmitting properties after curing are taken into account, the employment of a methyl group is more preferable. Examples of the linear polyorganoalkenyl siloxane are as shown below.

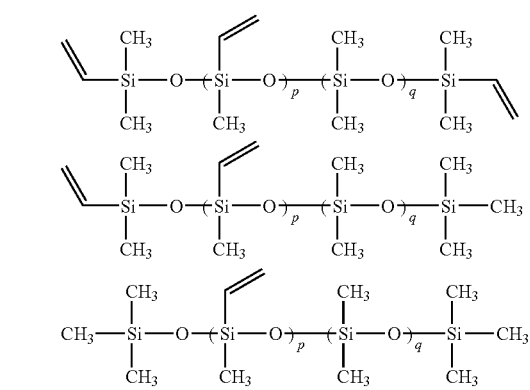

As examples of the cyclic polyorganoalkenyl siloxane, they include the compounds represented by the following general formula (a-2).

In the aforementioned general formula (a-2), n is an integer of 2 to 8, at least two of $R^1$ are respectively an alkenyl group and the balance thereof may be the same or different and are individually selected from a monovalent hydrocarbon group having 1-18 carbon atoms. As examples of the monovalent hydrocarbon group to be introduced as $R^1$ into the aforementioned general formula (a-2), they include for example an alkyl group, aryl group and aralkyl group. At least one of the hydrogen atoms in these hydrocarbon groups may be substituted by a heteroatom such as a halogen, Si, O, N or S atom. In this case, the employment of a methyl group is more preferable. Examples of the cyclic polyorganoalkenyl siloxane are as shown below.

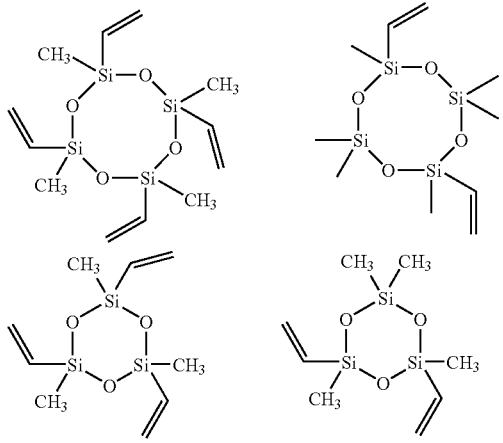

As the alkenyl-group-containing polysiloxane of three-dimensional or cage-like configuration, it is possible to employ the compounds represented by the following general formula (a-3).

$$R^1SiO_{3/2} \quad (a\text{-}3)$$

In this general formula (a-3), at least two of $R^1$ are respectively an alkenyl group and the balance thereof may be the same or different and are individually selected from a monovalent hydrocarbon group having 1-18 carbon atoms. As examples of the monovalent hydrocarbon group to be introduced as $R^1$ into the aforementioned general formula (a-3), they include for example an alkyl group, aryl group and aralkyl group. At least one of the hydrogen atoms in these hydrocarbon groups may be substituted by a heteroatom such as a halogen, Si, O, N or S atom. Among them, the employment of a methyl group is especially preferable. Examples of the alkenyl-group-containing polysiloxane of cage-like configuration are those represented by the following formula.

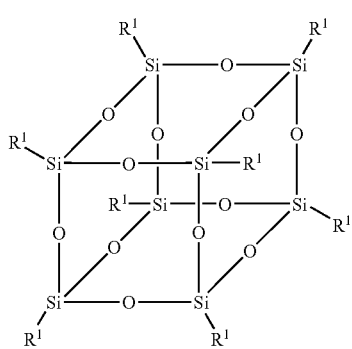

In this formula, at least two of $R^1$s are respectively an alkenyl group and the balance thereof may be an alkyl group such, for example, as a methyl group or hydroxyl group. More specifically, it may be a compound represented by the following chemical formula.

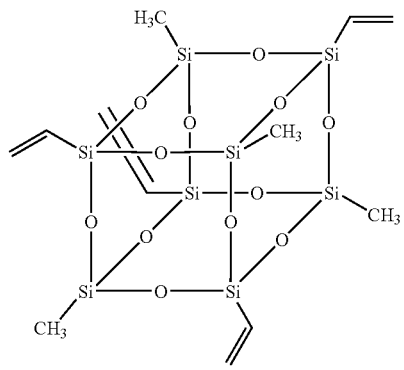

As examples of the linear polyorganohydrogen siloxane, they include the compounds represented by the following general formula (b-1).

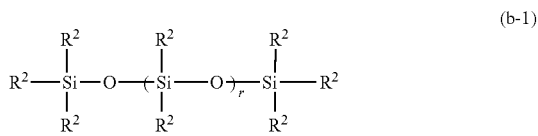

In this general formula (b-1), r is an integer of 0 to 10,000, at least two of $R^2$s are respectively a hydro group and the balance thereof may be the same or different and are individually selected from a monovalent hydrocarbon group having 1-18 carbon atoms. With respect to examples of the monovalent hydrocarbon group to be introduced as $R^2$ into the aforementioned general formula (b-1), they include for example an alkyl group, aryl group and aralkyl group. Especially, a methyl group is more preferable in terms of light transmitting properties and manufacturing cost. Examples of the linear polyorganohydrogen siloxane are those represented by the following chemical formulas.

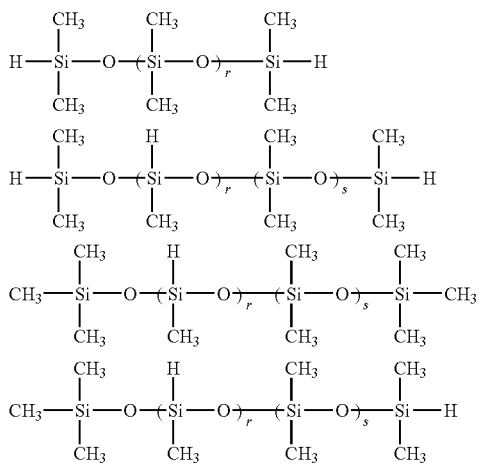

As examples of the cyclic polyorganohydrogen siloxane, they include the compounds represented by the following general formula (b-2).

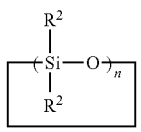
(b-2)

In this general formula (b-2), n is an integer of 2 to 8, at least two of $R^2$s are respectively a hydro group and the balance thereof may be the same or different and are individually selected from a monovalent hydrocarbon group having 1-18 carbon atoms. As examples of the monovalent hydrocarbon group to be introduced as $R^2$ into the aforementioned general formula (b-2), they include for example an alkyl group, aryl group and aralkyl group. At least one of the hydrogen atoms in these hydrocarbon groups may be substituted by a heteroatom such as a halogen, Si, O, N or S atom. Especially, a methyl group is more preferable in terms of light transmitting properties and manufacturing cost. Examples of the cyclic polyorganohydrogen siloxane are those represented by the following chemical formulas.

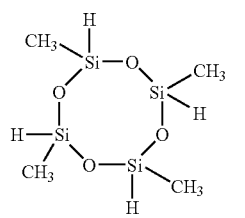 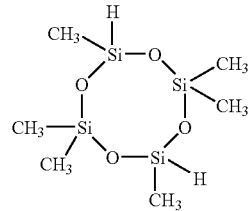

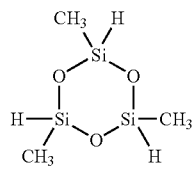 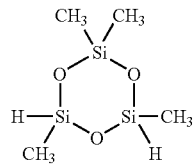

As the hydro-group-containing polysiloxane of three-dimensional or cage-like configuration, it is possible to employ the compounds represented by the following general formula (b-3).

$R^2SiO_{3/2}$ (b-3)

In this general formula (b-3), at least two of $R^2$s are respectively hydro group and the balance thereof may be the same or different and are individually selected from monovalent hydrocarbon group having 1-18 carbon atoms. As examples of the monovalent hydrocarbon group to be introduced as $R^2$ into the aforementioned general formula (b-3), they include for example alkyl group, aryl group and aralkyl group. At least one of the hydrogen atoms in these hydrocarbon groups may be substituted by a heteroatom such as a halogen, Si, O, N or S atom. Among them, methyl group is especially preferable.

Examples of the hydro-group-containing polysiloxane of cage-like configuration are those represented by the following general formula.

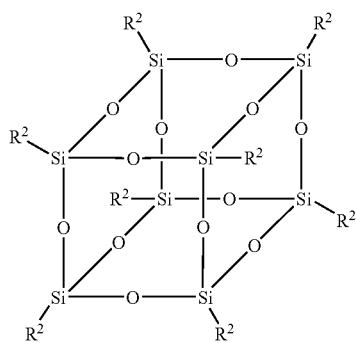

As already explained above with reference to the general formula (b-3), at least two of $R^2$s are respectively hydro group and the balance thereof may be methyl group. More specifically, it may be a compound represented by the following chemical formula.

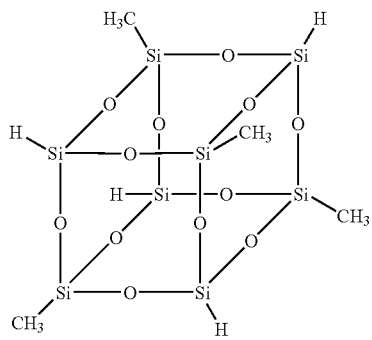

The silicone resin composition according to one embodiment may further comprise various kinds of additives insofar as the transparence and viscosity of the silicone resin composition would not be badly affected by the addition of these additives. Examples of such additives are, for example, silicon-based or fluorine-based antifoaming agents; and inorganic fillers such as fumed silica, silica aerosol, precipitated silica, crushed silica, diatomaceous earth, iron oxide, zinc oxide, titanium oxide, calcium oxide, magnesium carbonate, zinc carbonate and carbon black. If required, the silicone resin composition may further comprise other suitable additives including pigment, dyestuff, an adhesion assistant, a mildewproofing agent, a heat resistance improver, a flame retardant or an antioxidant.

Next, the present invention will be further explained specifically with reference to examples, which are not intended to limit the scope of the present invention.

With respect to the first opposite-terminals-sealed-with-vinyl-group-type silicone resin represented by the general formula (A1) and the second opposite-terminals-sealed-with-vinyl-group-type silicone resin represented by the general formula (A2), the compounds (PSA1) and (PSA2) were prepared.

(PSA1)

An opposite-terminals-sealed-with-vinyl-group-type polydimetylsilicone resin:

Viscosity: 10000 cSt; Equivalent weight: 0.03-0.04 eq/kg;

Available from GELEST Co., Ltd. (product name: DMS-V41);

This (PSA1) was a compound represented by the aforementioned general formula (A1) wherein methyl group was introduced therein as $R^{10}$ and k1 was 845. The value of k1 was determined by GPC.

(PSA2)

An opposite-terminals-sealed-with-vinyl-group-type polydimethylsilicone resin:

Viscosity: 20000 cSt; Equivalent weight: 0.025-0.030 eq/kg;

Available from GELEST Co., Ltd. (product name: DMS-V42);

This (PSA2) was a compound represented by the aforementioned general formula (A2) wherein methyl group was introduced therein as $R^{11}$ and k2 was 970. The value of k2 was determined by GPC.

Tetrakis(dimethylvinyloxy) silane was prepared as one example of the alkenyl-group-containing polysiloxane represented by the aforementioned general formula (B). A compound represented by the general formula (B) wherein $R^{12}$ is vinyl group and $R^{13}$ is methyl group will be referred to as (PSB).

The (PSC) shown below was prepared as one example of the hydro-group-containing polysiloxane represented by the aforementioned general formula (C).

(PSC):

A hydrosilicone resin containing 20-25% of the Q unit:

Viscosity: 4 cSt; Equivalent weight: 8.5 eq/kg;

Available from GELEST Co., Ltd. (product name: HQM105);

This (PSC) was a compound represented by the aforementioned average composition formula (C) wherein $R^{14}$ was methyl group and m was 2.4.

Further, trimethoxyvinyl silane was prepared as a silane coupling agent. This compound will be referred to as (TMVS).

The platinum catalyst employed herein was formed of a 2-propanol solution containing 2 mmol/L of platinic chloride.

Each of the aforementioned components was mixed together according to the recipe shown in the following Table 1 to prepare the silicone resin compositions of Examples.

TABLE 1

|   |   | Examples | | | |
|---|---|---|---|---|---|
|   |   | 1 | 2 | 3 | 4 |
| (A1) | PSA1 | 61.6 | 62.7 | 60.8 | 58.9 |
| (A2) | PSA2 | 2.4 | 4.5 | 6.6 | 8.7 |
| (B) | PSB | 24.9 | 21.1 | 21.1 | 21.0 |
| (C) | PSC | 9.5 | 9.8 | 9.9 | 9.8 |
|   | TMVS | 1.6 | 1.7 | 1.7 | 1.6 |
|   | Platinic chloride | 10 ppm | 10 ppm | 10 ppm | 10 ppm |

The proportion of each of polysiloxanes shown in Table 1 is indicated by weight %.

Further, each of the components was mixed together according to the recipe shown in the following Tables 2 and 3 to prepare the silicone resin compositions of Comparative Examples.

TABLE 2

|   |   | Comparative Examples | | | |
|---|---|---|---|---|---|
|   |   | 1 | 2 | 3 | 4 |
| (A1) | PSA1 | 0 | 12.4 | 25.4 | 54.3 |
| (A2) | PSA2 | 60.2 | 46.5 | 32.1 | 0 |
| (B) | PSB | 22.0 | 22.8 | 23.5 | 25.3 |
| (C) | PSC | 15.1 | 15.6 | 16.1 | 17.3 |
|   | TMVS | 1.7 | 2.7 | 2.8 | 2.9 |
|   | Platinic chloride | 10 ppm | 10 ppm | 10 ppm | 10 ppm |
|   | W2/W1 | ∞ | 3.75 | 1.26 | 0 |

TABLE 3

|   |   | Comparative Examples | | | |
|---|---|---|---|---|---|
|   |   | 5 | 6 | 7 | 8 |
| (A1) | PSA1 | 60.9 | 60.6 | 48.9 | 47.1 |
| (A2) | PSA2 | 0.3 | 0.6 | 12.2 | 14.1 |
| (B) | PSB | 15.3 | 15.3 | 15.3 | 15.3 |
| (C) | PSC | 21.7 | 21.7 | 21.7 | 21.7 |
|   | TMVS | 1.8 | 1.8 | 1.8 | 1.8 |
|   | Platinic chloride | 10 ppm | 10 ppm | 10 ppm | 10 ppm |
|   | W2/W1 | 0.005 | 0.01 | 0.25 | 0.3 |

As shown in Tables 2 and 3, the composition of Comparative Example 1 was formulated so as not to contain the first opposite-terminals-sealed-with-vinyl-group-type silicone resin. Whereas, the composition of Comparative Example 4 was formulated so as not to contain the second opposite-terminals-sealed-with-vinyl-group-type silicone resin. The compositions of Comparative Examples 2 and 3 were all formulated to contain the first opposite-terminals-sealed-with-vinyl-group-type silicone resin and the second opposite-terminals-sealed-with-vinyl-group-type silicone resin at a weight ratio (w2/w1) falling outside the prescribed range. More specifically, in the case of the composition of Examples 2, the weight ratio (w2/w1) was set to 3.75, and in the case of the composition of Examples 3, the weight ratio (w2/w1) was set to 1.26.

All of the aforementioned resin compositions were allowed to cure to obtain cured products and the light transmitting properties of these cured products were investigated. More specifically, each of these compositions was coated on a quartz substrate using a bar coater to form a coated film. Then, the coated film was placed, together with the quartz substrate, on a hot plate heated to a predetermined temperature and subjected to heat treatment wherein the coated film was heated at a temperature of 100° C. for one hour and then at a temperature of 150° C. for three hours to cure the coated film. As a result, a cured material consisting of a membrane having a thickness of 0.5 mm was formed. Thereafter, a low-pressure mercury lamp was disposed at a position which is spaced apart from the membrane by a distance of 10 cm and the membrane was irradiated by the mercury lamp for 1000 hours.

Thereafter, using a spectrophotometer, the light transmittance of the cured products was measured. The measurement of light transmittance was conducted using two wavelengths, i.e., 400 and 300 nm. The light transmittance to the light having a wavelength of 400 nm is considered as being an indication of transparence of a white LED as the fluorescent substance thereof is excited with ultraviolet rays. Likewise, the light transmittance to the light having a wavelength of 300 nm is also considered as being an indication of transparence of a white LED. In order to obtain a silicone resin sealing material which retains excellent light transmittance for a long period of time, it is required that the light transmittance to the light of not only the wavelength of 400 nm but also the wavelength of 300 nm should be 85% or more.

The measurement of hardness of samples was performed as follows. A silicone resin composition was poured into a recessed portion (10 mm×10 mm×10 mm) of a Teflon (registered trademark) substrate and heated for one hour at 100° C. and then for four hours at 150° C. to thermally cure each of the samples. Thereafter, by an Ascar type "A" harness tester, the measurement of hardness to each sample was repeated at least three times to determine an average value of hardness. If the hardness of a sample is 40 or more, the sample was assumed as being acceptable.

Furthermore, using IR reflow, the peeling at an interface between the silicone resin and the package was observed. The samples for the IR reflow were manufactured as follows. The silicone resin composition was poured into a recess (a columnar configuration having a diameter of 3 mm and a height of 2 mm) of the package which was formed of polyphthal amide (PPA) resin and then heated at a predetermined temperature to cure the silicone resin composition. Thereafter, the cured resin was introduced, together with the package, into a high-temperature humidifying tank to allow the cured product of silicone resin to absorb moisture. Then, the cured product of silicone resin was subjected to the IR reflow treatment (260° C./10 seconds). Under the same conditions, the moisture absorption and the IR reflow were repeated. The peeling at an interface between the silicone resin and the package was observed by a microscope to investigate the number of repetitions of the aforementioned process which could be executed before the occurrence of peeling was recognized. If the number of repetitions was five or more, it can be said as having sufficient adhesive properties.

The results thus obtained are summarized in the following Table 4.

TABLE 4

| | Transmittance (400 nm) | Transmittance (300 nm) | Hardness | Number of repetitions before occurrence of peeling |
|---|---|---|---|---|
| Example 1 | 94 | 92 | 40 | 5 or more |
| Example 2 | 94 | 92 | 42 | 5 or more |
| Example 3 | 94 | 92 | 44 | 5 or more |
| Example 4 | 94 | 92 | 46 | 5 or more |
| Comparative Example 1 | 50 | 50 | 66 | 0 |
| Comparative Example 2 | 50 | 50 | 55 | 0 |
| Comparative Example 3 | 50 | 50 | 50 | 0 |
| Comparative Example 4 | 94 | 92 | 30 | 4 |
| Comparative Example 5 | 94 | 92 | 32 | 4 |
| Comparative Example 6 | 94 | 92 | 36 | 4 |
| Comparative Example 7 | 70 | 70 | 45 | 3 |
| Comparative Example 8 | 70 | 70 | 48 | 2 |

As shown in Table 4, as far as the light transmittance is concerned, the composition of every Example was found excellent in transmittance of light of wavelength 400 and 300 nm. On the other hand, in the cases of the compositions of Comparative Examples 1, 2, 3, 7 and 8, the cured products were turned cloudy and therefore the light transmittance of all of them was lowered. This phenomenon was recognized in the compositions where the ratio between w2 and w1 was $w2/w1 \geqq 0.2$. In the compositions where the ratio between w2 and w1 was $w2/w1 \leqq 0.03$ (Comparative Examples 4, 5 and 6), they indicated excellent light transmittance.

With respect to the hardness of cured product, the compositions of every Examples indicated 40 or more. Whereas, in the compositions of Comparative Examples, some of them where the ratio between w2 and w1 was $w2/w1 \geqq 0.2$ (Comparative Examples 1, 2, 3, 7 and 8) indicated a hardness ranging from 40 to as high as 67. However, in the samples the ratio between w2 and w1 was $w2/w1 \leqq 0.03$ (Comparative Examples 4, 5 and 6), the indicated a hardness of less than 40.

With respect to adhesive properties of cured products, the resin compositions of every Examples were found excellent in adhesive properties with the number of aforementioned repetitions before the occurrence of peeling being five or more. In the case of the compositions of Comparative Examples, when the ratio of w2/w1 was confined to the range of: $w2/w1 \geqq 0.2$ (Comparative Examples 1, 2, 3, 7, 8), the number of aforementioned repetitions was less than five, and when the ratio of w2/w1 was confined to the range of: $w2/w1 \leqq 0.03$ (Comparative Examples 4, 5, 6), the number of aforementioned repetitions was four but less than five.

Due to a combined use of four specific kinds of polysiloxane, it is now possible to obtain a silicone resin composition which is excellent in transparency and adhesion. Additionally, it is possible to obtain a silicone resin composition which is almost free from discoloration with time.

The semiconductor device shown in FIGURE is an LED light-emitting device comprising a substrate 4 having a recess, a diode chip 6 placed in this recess, and a transparent resin layer 2 covering the diode chip 6. The substrate 4 is provided with an inner electrode 5a and an outer electrode 5b. The connecting terminal (not shown) of the diode chip 6 is connected, through a conductive wire 3, with the inner electrode 5a.

Since the light emits after passing through the resin layer, the transparent resin layer 2 covering the diode chip 6 is required to exhibit high transparency. Since the silicone resin composition according to one embodiment exhibits excellent transparency as described above, the silicone resin composition can be quite suited for forming the transparent resin layer 2.

Incidentally, since a semiconductor device can be encapsulated with a cured material to be created through the curing of the silicone resin composition according to one embodiment, this silicone resin composition can be employed for the manufacture of various kinds of semiconductor devices. For example, by flip-chip packaging, a semiconductor device can be encapsulated by a cured material of the silicone resin composition of the embodiment, thereby obtaining a semiconductor device which is excellent in alleviating any thermal stress. Further, the silicone resin composition of the embodiment may be applied to the sealing of the electrolyte of pigment-sensitizing solar battery. When the silicone resin composition of the present invention is applied to the pigment-sensitizing solar battery, the durability thereof would be enhanced.

Moreover, the silicone resin composition according to one embodiment can be applied not only to the semiconductor device but also to various purposes. For example, it can be suitably used in a wide range of end-use, for example, for forming a dipping agent for general industrial purpose, a profiling rubber, a molding material, a stripping coating agent, an addition reaction type silicone rubber or silicone gel such as a dental impression material, etc. Even when the silicone resin composition of the embodiment is used for these purposes, it is possible to secure the effects of high adhesive properties, thus indicating wide range of utility.

According to the embodiment of the present invention, there are provided a silicone resin composition which is low in viscosity, excellent in transparency, capable of obviating discoloration with time and also capable of giving a cured material excellent in adhesive properties, as well as a semiconductor device whose semiconductor elements are encapsulated with a cured material of this silicone resin composition.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A silicone resin composition comprising:
   a) a first silicone resin represented by the following general formula (A1) and incorporated at a first weight (w1);

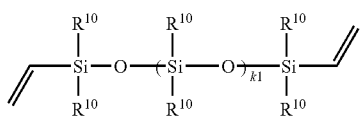
(A1)

wherein $R^{10}$s may be the same or different and are individually selected from alkyl group having 1 to 4 carbon atoms; and k1 is a number satisfying $800 \leq k1 < 900$;

b) a second silicone resin represented by the following general formula (A2) and incorporated at a second weight (w2);

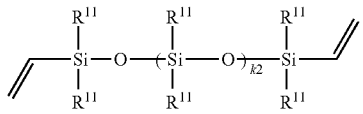
(A2)

wherein $R^{11}$s may be the same or different and are individually selected from alkyl group having 1 to 4 carbon atoms; k2 is a number satisfying $k1+100 \leq k2 < 1300$; and w2 is a value satisfying $0.03 \leq w2/w1 \leq 0.2$;

c) an alkenyl-group-containing polysiloxane represented by the following formula (B):

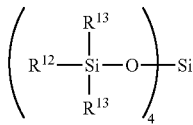
(B)

wherein $R^{12}$ is alkenyl group; and $R^{13}$ is an alkyl group having 1 to 4 carbon atoms;

d) hydro-group-containing polysiloxane represented by the following average composition formula (C):

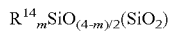
(C)

wherein $R^{14}$ constituted by 0.1 to 95 mole % of a hydro group and the balance of an alkyl group having 1 to 4 carbon atoms; and m is an integer of 1 to 3; the hydro-group-containing polysiloxane having a weight average molecular weight of 100 to 10000 and including 10 to 50 mole % of Q unit represented by formula:

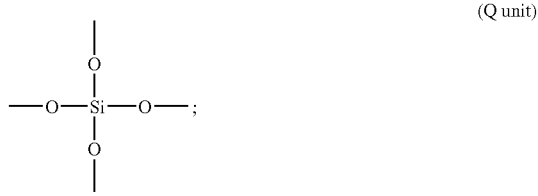
(Q unit)

and
   e) a hydrosilylating catalyst.

2. The composition according to claim 1, wherein the alkyl group to be introduced into the $R^{10}$s of the general formula (A1) is selected from methyl group and ethyl group.

3. The composition according to claim 1, wherein the viscosity of the first polysiloxane is confined to 5,000 to 16,000 mPa·s.

4. The composition according to claim 1, wherein the first polysiloxane is selected from the groups shown below:

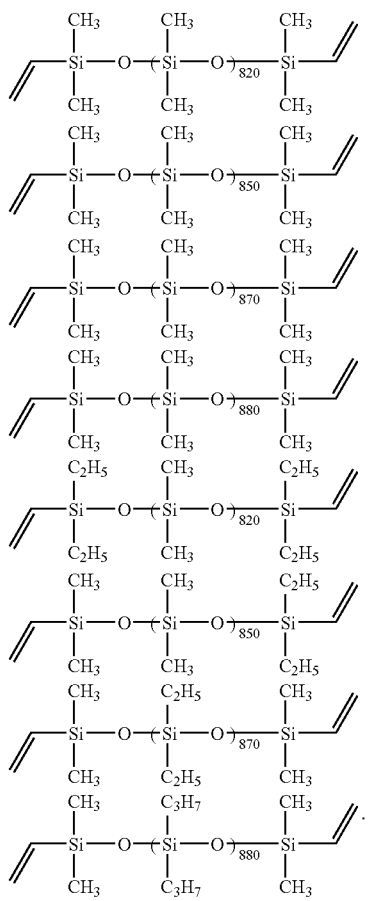

5. The composition according to claim 1, wherein the alkyl group to be introduced into the $R^{11}$s of the general formula (A2) is selected from methyl group and ethyl group.

6. The composition according to claim 1, wherein the viscosity of the second polysiloxane is confined to 18,000 to 40,000 mPa·s.

7. The composition according to claim 1, wherein the second polysiloxane is selected from the groups shown below:

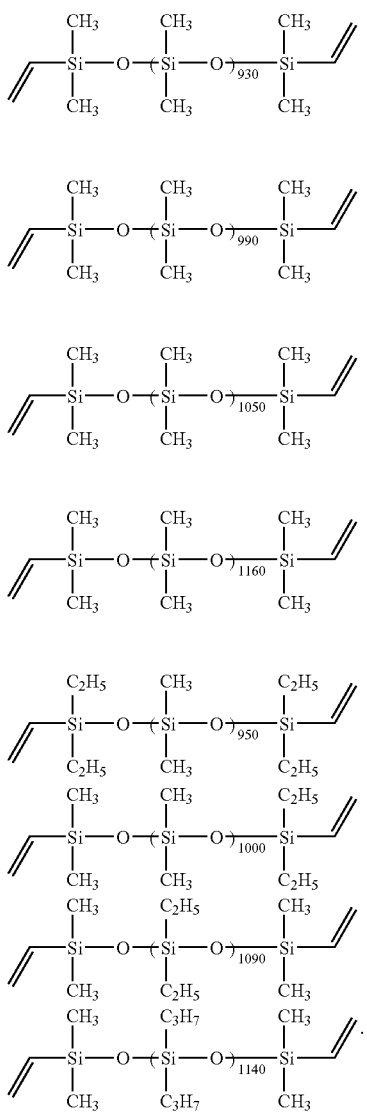

8. The composition according to claim 1, wherein a total content of the first polysiloxane and the second polysiloxane is confined to the range of 40 to 80 wt % based on a total weight of the silicone resin composition.

9. The composition according to claim 1, wherein a total content of the first polysiloxane and the second polysiloxane is confined to the range of 50 to 75 wt % based on a total weight of the silicone resin composition.

10. The composition according to claim 1, wherein a ratio between w2 and w1 (w2/w1) is 0.04-0.18.

11. The composition according to claim 1, wherein the alkenyl group to be introduced into the $R^{12}$ of the general formula (B) is selected from the group consisting of vinyl group, allyl group, butenyl group and pentenyl group.

12. The composition according to claim 1, wherein the alkyl group to be introduced into the $R^{13}$s of the general formula (B) is methyl group.

13. The composition according to claim 1, wherein the alkenyl group to be introduced into the $R^{12}$ of the general formula (B) is vinyl group.

14. The composition according to claim 1, wherein the alkenyl-group-containing polysiloxane is selected from the groups shown below:

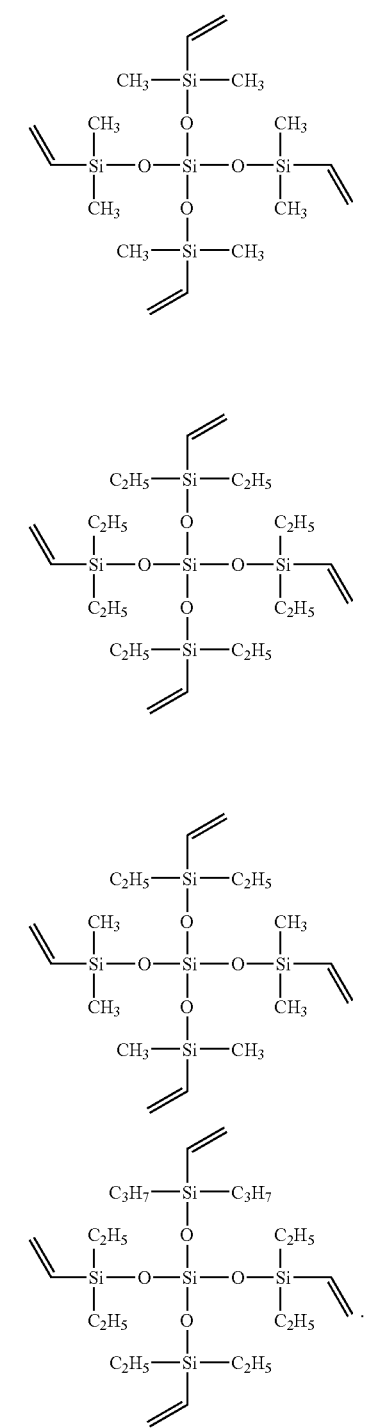

15. The composition according to claim 1, wherein the alkenyl-group-containing polysiloxane is contained at a content of 10-40 wt % of the composition.

16. The composition according to claim 1, wherein the alkyl group to be introduced into the $R^{14}$ of the average composition formula (C) is methyl group.

17. The composition according to claim 1, wherein the hydro-group-containing polysiloxane has a weight average molecular weight ranging from 200 to 5,000.

18. The composition according to claim 1, wherein the average composition formula (C) contains 0.1 to 10 wt % of trimethoxysilyl group.

19. The composition according to claim 1, further comprising at least one selected from the group consisting of chain silicone resin, cyclic silicone resin and cage silicone resin.

20. A resin-encapsulated semiconductor device comprising:
 a light-emitting element; and
 a resin layer sealing the light-emitting element and formed of a cured material of the silicon resin composition claimed in claim 1.

* * * * *